United States Patent
Mehta

(10) Patent No.: US 8,085,580 B2
(45) Date of Patent: Dec. 27, 2011

(54) SYSTEM FOR BITCELL AND COLUMN TESTING IN SRAM

(75) Inventor: Aswin N. Mehta, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 163 days.

(21) Appl. No.: 12/819,393

(22) Filed: Jun. 21, 2010

(65) Prior Publication Data

US 2010/0254180 A1    Oct. 7, 2010

Related U.S. Application Data

(62) Division of application No. 12/115,122, filed on May 5, 2008, now Pat. No. 7,768,850.

(60) Provisional application No. 60/927,704, filed on May 4, 2007.

(51) Int. Cl.
*G11C 11/00* (2006.01)

(52) U.S. Cl. .... 365/154; 365/156; 365/204; 365/189.07

(58) Field of Classification Search .................. 365/154, 365/156, 204, 189.07
See application file for complete search history.

(56) References Cited

U.S. PATENT DOCUMENTS

| | | | |
|---|---|---|---|
| 5,781,469 A | 7/1998 | Pathak et al. | |
| 7,042,780 B2 * | 5/2006 | Lee | 365/203 |
| 2006/0039180 A1 * | 2/2006 | Kawasumi | 365/154 |

* cited by examiner

*Primary Examiner* — Huan Hoang

(74) *Attorney, Agent, or Firm* — Rose Alyssa Keagy; Wade J. Brady, III; Frederick J. Telecky, Jr.

(57) ABSTRACT

A system comprises a storage cell coupled to multiple bitlines and a transistor that couples to the multiple bitlines in parallel with the storage cell. The transistor is activated while the storage cell is read.

5 Claims, 3 Drawing Sheets

SYSTEM FOR BITCELL AND COLUMN TESTING IN SRAM

CROSS-REFERENCE TO RELATED APPLICATIONS

This application is a divisional of U.S. patent application Ser. No. 12/115,122, filed May 5, 2008, now U.S. Pat. No. 7,768,850 which is a nonprovisional of U.S. provisional Patent Application No. 60/927,704 filed May 4, 2007, expired, which are herein incorporated by reference.

BACKGROUND

Storage devices, such as static random access memory (SRAM) devices, are prone to manufacturing defects that negatively impact functionality. For example, individual bitcells or columns may be defective and, as a result, may store and/or output data inaccurately. Identification of defective storage components enables the removal of such components and facilitates an increase in storage device accuracy.

SUMMARY

The problems noted above are solved in large part by a system for bitcell and column testing in storage devices. An illustrative embodiment includes a system comprising a storage cell coupled to multiple bitlines and a transistor that couples to the multiple bitlines in parallel with the storage cell. The transistor is activated while the storage cell is read such that a signal on at least one of the multiple bitlines is weakened.

Another illustrative embodiment includes a system that comprises a storage cell coupled to a first bitline and to a second bitline, a first transistor that couples to the first bitline and to ground, and a second transistor that couples to the second bitline and to ground. At least one of the first and second transistors is activated during a read operation of the storage cell.

Yet another illustrative embodiment includes a system that comprises multiple bitlines, a multiplexer coupled to the bitlines that selects data from a pair of the multiple bitlines and outputs the data on a pair of output lines, an amplifier, coupled to the pair of output lines, that amplifies the data, a first transistor coupled to a first of said pair of output lines and to ground, and a second transistor coupled to the second of the pair of output lines and to ground. At least one of the first and second transistors is activated prior to activating a wordline. The wordline couples to a bitcell coupled to the multiple bitlines.

BRIEF DESCRIPTION OF THE DRAWINGS

For a detailed description of exemplary embodiments of the invention, reference will now be made to the accompanying drawings in which.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct electrical connection. Thus, if a first device couples to a second device, that connection may be through a direct electrical connection, or through an indirect electrical connection via other devices and connections. When "weakened," a logic "1" signal is manipulated to more closely resemble a logic "0." When "weakened," a logic "0" signal is manipulated to more closely resemble a logic "1."

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Disclosed herein are various embodiments of a technique that enables the identification of defective storage components (e.g., bitcell columns) in storage devices (e.g., static random access memory (SRAM)). The technique comprises disposing multiple transistors in a storage device such that, when activated, each of these transistors weakens a memory signal on a bus to which it is coupled. This weakening is intended to simulate possible harsh, "real-world" operating conditions the storage device may encounter when used in high-speed electronics (e.g., processors). The transistors are sized to weaken the memory signals to a predetermined degree.

If, despite such weakening, the memory signals still accurately reflect the data values stored in their respective bitcells, the bitcells and bitcell columns are determined to be functioning properly. However, if such weakening causes the memory signals to cease accurately reflecting the data values stored in their respective bitcells, the bitcells and/or bitcell columns are determined to be defective and may be replaced. The bitcells and/or bitcell columns are determined to be defective because they output memory signals that are too weak to withstand the weakening described above, which, as explained, is representative of operational demands in high-speed electronics.

Figure 1:
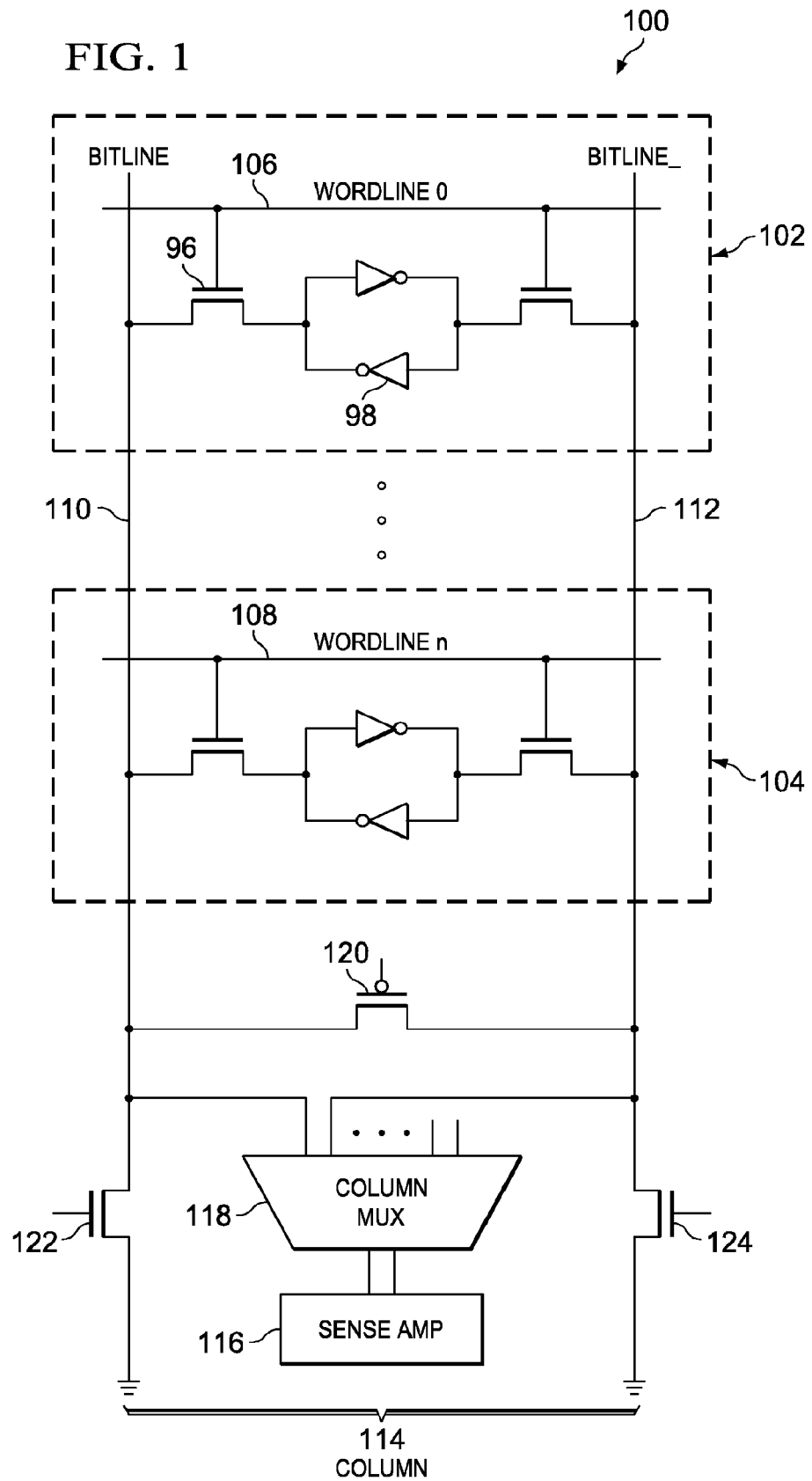
FIG. 1 shows an illustrative storage device column, in accordance with various embodiments.

FIG. 1 shows a storage device 100 comprising multiple storage cells 102 and 104 (e.g., bitcells). The storage device 100 preferably comprises an SRAM, although any suitable device may be used. Although only two storage cells are shown, any number of storage cells may be used. The storage cell 102 couples to a wordline 106, while the storage cell 104 couples to a wordline 108. Each of the storage cells 102 and 104 couples to bitlines 110 and 112. In at least some embodiments, the bitline 110 carries the data that is to be written to or that has been read from a storage cell, while the bitline 112 carries the inverse of the data on the bitline 110. The wordlines 106 and 108 control the storage cells 102 and 104 and dictate which of the cells is read from or written to at a given time. Data that is read from or written to an activated cell is carried on the bitlines 110 and 112. The bitlines 110 and 112, together with the multiple storage cells 102 and 104, are collectively referred to as a column 114.

Data on the bitlines 110 and 112 is amplified by sense amplifier 116. The sense amplifier 116 may amplify signals received from any one of several columns in the storage device 100. The column whose signals are amplified by the sense amplifier 116 is selected by the column multiplexer 118.

In accordance with preferred embodiments, the column 114 comprises a transistor 120, such as a p-channel transistor, that couples the bitlines 110 and 112. When activated, the transistor 120 acts as a resistor that causes the signals carried on the bitlines 110 and 112 to be weakened. For example, the transistor 120 may weaken a strong logic "1" carried on the bitline 110 so that the bitline 110 carries only a weak logic "1." The transistor 120 may be sized as desired to produce any desired target resistance between the bitlines 110 and 112 and, as a result, a desired weakening of the signals on the bitlines 110 and 112. In at least some embodiments, the transistor 120 is approximately 20% of the size of transistors in the storage cells 102 and 104. The resulting resistance generated by the transistor 120 may be on the order of approximately 50-100 kilo Ohms. Thus, approximately 20% of the current on the bitline(s) 110 and/or 112 may be shunted out by the transistor 120.

Prior to activating the transistor 120, the bitlines 110 and 112 are charged to a predetermined level. For example, the bitline 110 may be charged to a logic "1" while the bitline 112 is discharged to a logic "0." The transistor 120 is then activated. Activation of the transistor 120 causes current to flow past the transistor 120, and the transistor 120 acts as a resistor to this current. Thus, for example, the logic "1" on the bitline 110 is weakened. If, despite this weakening, the bitline 110 still carries a signal that can be identified as a logic "1," then the storage cells 102 and 104, and the column 114 in general, are determined to be functioning properly. However, if this weakening causes the bitline 110 to carry a signal that can no longer be clearly identified as a logic "1," then the storage cells and/or column 114 are determined to be defective, and may be replaced, as desired. The technique described herein is performed for each of the storage cells 102 and 104. Testing the storage cells independently enables the determination of which cells are problematic or defective. The number of storage cells that test as defective is indicative of whether the storage cells are actually defective or whether the bitlines are defective. Specifically, if all of the storage cells in a given column test as defective, it is more likely that the bitlines coupling the storage cells together are defective and need to be repaired or replaced. However, if some of the storage cells in a given column test as defective and other storage cells in that same column do not test as defective, then it is more likely that the bitlines are functioning properly, and that the storage cells that tested as defective are actually defective and required repair or replacement.

As explained above, when the transistors 120 are activated, the bitline 110 and/or 112 is read to determine whether the transistor-induced weakening has rendered the signal on that bitline unidentifiable. Whether a signal on a bitline is considered "unidentifiable" may be determined by comparing the signal strength to a predetermined, preprogrammed threshold value which, in some embodiments, is a minimum threshold of the sense amplifier 116. If the signal strength on the bitline meets or exceeds this threshold value, the signal on the bitline is considered "identifiable," and the column 114 is determined to be functioning properly. However, if the signal strength on the bitline fails to meet the threshold value, the signal on the bitline is considered "unidentifiable," and the column 114 is determined to be defective.

As shown, the column 114 further comprises additional transistors 122 and 124. The transistor 122 couples the bitline 110 with GND, while the transistor 124 couples the bitline 112 with GND. Preferably, the transistors 122 and 124 are n-channel transistors, although other types of transistors also may be used. In operation, the transistors 122 and 124 preferably are activated at separate times. When the transistor 122 is activated, the transistor 122 acts as a resistor to current that flows between the bitline 110 and GND. When the transistor 124 is activated, the transistor 124 acts as a resistor to current that flows between the bitline 112 and GND. The transistors 122 and 124 may be sized as desired to produce target resistance levels. In at least some embodiments, the transistors 122 and 124 are sized so that 20% of the current on the bitline 110 and/or bitline 112 is shunted out through the transistors 122 and/or 124.

Prior to activating the transistor 122, the bitline 110 is charged to a predetermined level. For example, the bitline 110 may be charged to a logic "1" while the bitline 112 is charged to a logic "0." The transistor 122 is then activated. Activation of the transistor 122 causes current to flow past the transistor 122, and the transistor 122 acts as a resistor to this current. Thus, for example, the logic "1" on the bitline 110 is weakened. If, despite this weakening, the bitline 110 still carries a signal that can be identified as a logic "1," then the storage cells 102 and 104, and the column 114 in general, are determined to be functioning properly. However, if this weakening causes the bitline 110 to carry a signal that can no longer be clearly identified as a logic "1," then the storage cells and/or column 114 are determined to be defective, and may be replaced, as desired. The transistor 124 is operated in a similar manner for the bitline 112.

Figure 2:
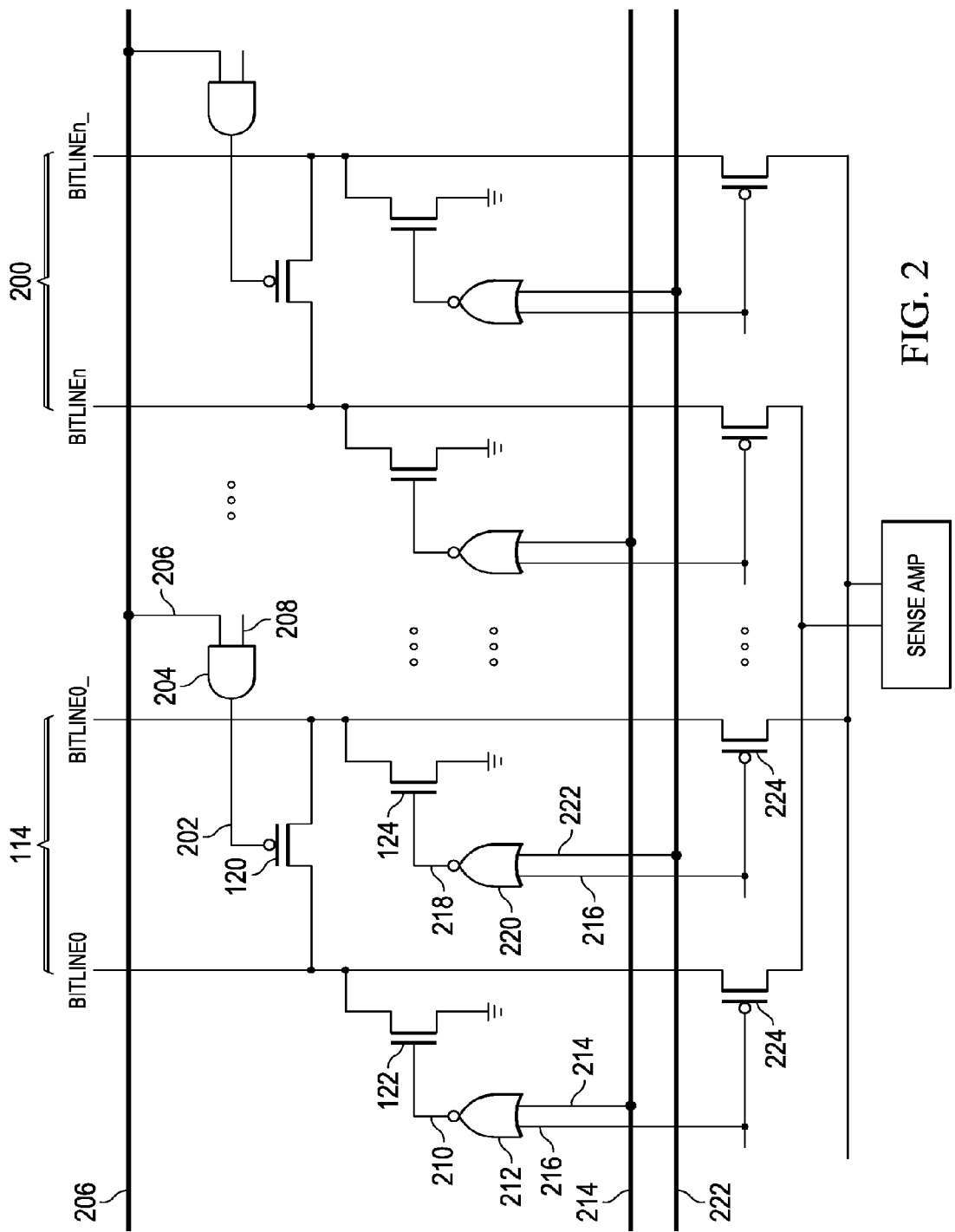
FIG. 2 shows an illustrative set of storage device columns, in accordance with various embodiments.

FIG. 2 shows how the transistors 120, 122 and 124 are operated. FIG. 2 shows the column 114 as well as an additional column 200. The contents of each of the columns 114 and 200 are virtually identical. Additional columns besides the columns 114 and 200 may be used. A gate of the transistor 120 of column 114 receives a signal 202 that is generated by logic gate 204 (e.g., a NAND gate). In turn, the logic gate 204 receives signals 206 and 208 as inputs. The signal 208 is specific to column 114, while the signal 206 is provided to both columns 114 and 200.

A gate of the transistor 122 receives a signal 210 that is generated by logic gate 212 (e.g., a NOR gate). In turn, the logic gate 212 receives signals 214 and 216 as inputs. The signal 216 is specific to column 114 and is the inverse of the signal 208. The signal 214 is provided to both columns 114 and 200.

A gate of the transistor 124 receives a signal 218 that is generated by logic gate 220 (e.g., a NOR gate). In turn, the logic gate 220 receives signals 216 and 222. The signal 216 is the same signal that is provided to the logic gate 212 and is the inverse of the signal 208. The signal 222 is provided to both columns 114 and 200. The signal 216 also controls transistors 224 (e.g., p-channel transistors) used for multiplexing purposes, as explained above.

The signals 206, 208, 214, 216, 220 and 222 are generated by any suitable circuit logic. In at least some embodiments, these signals are generated by a testing system that is coupled to the storage device 100. The signals may be controlled manually, for example, by an engineer or designer operating the testing system to test the storage device 100. Preferably, only one of the signals 206, 214 and 222 is activated at a time.

Figure 3:
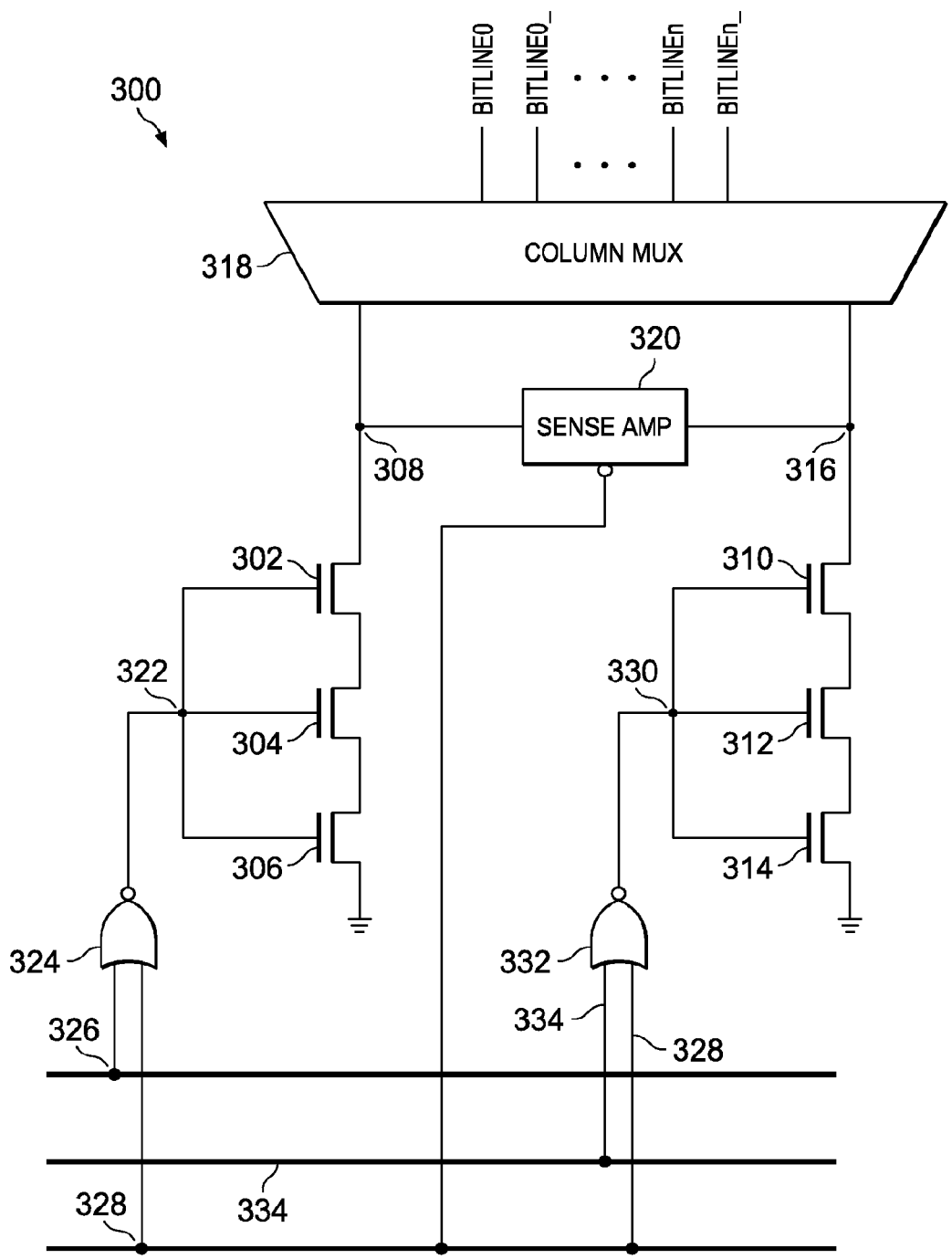
FIG. 3 shows illustrative testing hardware at a sense-amplifier level in a storage device column, in accordance with various embodiments.

FIG. 3 shows an alternative embodiment. Specifically, FIG. 3 shows a storage device 300 in which transistors 302, 304 and 306 are coupled between a node 308 and GND. The storage device 300 further comprises transistors 310, 312 and 314 coupled between a node 316 and GND. The nodes 308 and 316 are outputs of a column multiplexer 318, similar to the column multiplexer 118 shown in FIG. 1. The nodes 308 and 316 also couple to a sense amplifier 320, which amplifies the signals on the nodes 308 and 316 for output. The storage device 300 may comprise a transistor 315 (e.g., a p-channel transistor) that couples the nodes 308 and 316. The transistor 315 may be controlled by a signal from a testing system as desired.

The gates of the transistors 302, 304 and 306 couple to a node 322. The signal on node 322 is generated by a logic gate (e.g., a NOR gate) 324. In turn, the logic gate 324 receives as inputs signals 326 and 328. The signal 326 is similar to or the same as the activation signal 214 shown in FIG. 2. The signal 328 is an enabling signal for the sense amplifier 320. For this reason, the signal 328 also is provided to the sense amplifier 320.

The gates of the transistors 310, 312 and 314 couple to a node 330. The signal on node 330 is generated by a logic gate 332 (e.g., NOR gate). In turn, the logic gate 332 receives as inputs signals 328 and 334. The signal 334 is similar to or the same as the input signal 222 shown in FIG. 2. The signals 326, 328 and 334 are generated by a testing system such as that described above.

In operation, the signals on nodes 308 and 316 are forced to known values by the selected storage cell, so that testing may be performed. For example, the signal on node 308 may be at a higher voltage compared to node 316. The signals 326, 328 and 334 are then adjusted so that either the transistors 302, 304 and 306 are activated or so that the transistors 310, 312 and 314 are activated, depending on whether the voltage level on node 308 is higher than that on node 316, or vice versa. When the transistors 302, 304 and 306 are activated, they act as resistors to current that flows between the node 308 and GND. As a result, the signal present on node 308 is weakened. For example, if the signal on node 308 is a strong logic "1," activation of the transistors 302, 304 and 306 causes the signal on node 308 to be weakened to a weak logic "1." As with the embodiments shown in FIGS. 1-2, if this weakening causes the signal on node 308 to become unidentifiable (i.e., if the signal on node 308 was forced to a logic "1" prior to testing, but the signal on node 308 is no longer identifiable as a logic "1"), there is a defect associated with the column currently selected by the column multiplexer 318. However, if, despite this weakening, the signal on node 308 remains identifiable, there is no defect associated with the column currently selected by the column multiplexer 318. As previously explained with regard to FIGS. 1-2, the determination as to whether a signal is "identifiable" or "unidentifiable" may be performed using predetermined, preprogrammed threshold values (e.g., using the sense amplifier's threshold value). The transistors 310, 312 and 314 are operated in a manner similar to that in which the transistors 302, 304 and 306 are operated.

Storage devices such as those shown in FIGS. 1-3 are often implemented in electronic devices (e.g., processors) that operate much faster than the testing systems used to test the storage devices. Thus, the testing systems are not always able to simulate the worst-case, or "harshest," conditions under which the storage devices may have to operate. For example, one such worst-case condition occurs when a column such as 114 in FIG. 1 must alternatively read a series of "1s" and "0s" and must do so at substantially high processing speeds. More specifically, in switching from a "1" to a "0," a column in a high-speed processor must quickly overcome any residual voltage indicative of a "1" so that the storage cell clearly indicates that a "0" is stored therein. Likewise, in switching from a "0" to a "1," a column in a high-speed processor must quickly overcome any residuals indicative of a "0" so that the storage cell clearly indicates that a "1" is stored therein. Testing systems generally do not operate as fast as these high-speed processors and, as a result, the storage cells/storage devices do not get tested for the "residual effect" described above that actually occurs in high-speed processors.

The storage device 300 of FIG. 3 overcomes this deficiency of slow testing systems by simulating the "residual effect" described above. Specifically, the signals 326, 328 and/or 334 are adjusted so that one or more of the transistors 302, 304 and 306 (or the transistor 310, 312 and 314) are activated just before the wordlines of the storage cells (e.g., the wordlines 106 and 108 shown in FIG. 1) are activated. Further, the storage cells in the storage device are written to store a common predetermined value (e.g., some or all of the storage cells store a "0" if all of the transistors 310, 312, 314 will be activated; alternatively, some or all of the storage cells store a "1" if all of the transistors 302, 304, 306 will be activated).

For example, the storage cells may be programmed to store a logic "1." As a result, when one or more (e.g., all) of the transistors 302, 304, 306 (or transistors 310, 312, 314) are activated, the signal on node 308 is pulled low toward GND (i.e., a logic "0"). The wordlines are then activated, causing the "1s" stored in one of the storage cells to pass through the column multiplexer 318 and to force the signal on node 308 toward a logic "1." In this way, an artificial "residual effect" is created to simulate operating conditions in high-speed processors. The storage device 300 must overcome the logic "0" that is present on the node 308 and must quickly change the value on the node 308 to a logic "1." If the storage device 300 overcomes the residual effect so that the signal on node 308 is clearly ascertained to be a "1" and the signal on node 316 is clearly ascertained to be a "0" by the time the sense amplifier 320 samples the signals on nodes 308 and 316 for amplification, the storage device 300 passes the residual effect test. However, if the storage device 300 is unable to overcome the residual effect and the signals on nodes 308 and 316 are not clearly ascertainable by the time the sense amplifier 320 samples the signals, the storage device 300 has failed the residual effect test. A similar technique may be implemented for the transistors 310, 312 and 314 by filling the storage cells in the storage device with logical "0s."

Although the transistors 302, 304, 306, 310, 312 and 314 may be sized as desired, in some embodiments, the transistors 304 and 312 are sized to be identical to or at least similar to the access transistor 96 shown in FIG. 1. Similarly, in some embodiments, the transistors 306 and 314 are sized to be identical to or at least similar to an n-channel transistor in the inverter 98 shown in FIG. 1. This allows the amount of shunting to track with the strength of the storage cells. The transistors 302 and 310 are sized to achieve the desired residual effect for the residual effect test explained above. Making the transistors bigger will increase the magnitude of the residual effect; conversely, making the transistors smaller reduces the magnitude of the residual effect. In some embodiments, the transistors 302, 304 and 306 are replaced with a single transistor. Similarly, in such embodiments, the transistors 310, 312 and 314 are replaced with a single transistor.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system, comprising:
a storage cell coupled to a first bitline and to a second bitline;
a first transistor that couples to the first bitline and to ground;
a second transistor that couples to the second bitline and to ground; wherein at least one of the first and second transistors is activated during a read operation of the storage cell; and
means for comparing a signal on one of said first and second bitlines to an expected signal for determining whether said storage cell is defective.

2. The system of claim 1, wherein the system comprises a static random access memory (SRAM).

3. The system of claim 1, wherein the first and second transistors are n-channel transistors.

4. The system of claim 1, wherein the first transistor is sized so that approximately 20% of current on said first bitline is diverted to ground via said first transistor.

5. The system of claim 1, wherein, after activating said first transistor, a signal on the first bitline is compared to an expected signal to determine whether the system is defective.

* * * * *